United States Patent
Lin

(10) Patent No.: US 8,570,084 B2
(45) Date of Patent: *Oct. 29, 2013

(54) CIRCUITS AND METHODS FOR CLOCK SIGNAL DUTY-CYCLE CORRECTION

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/610,526

(22) Filed: Sep. 11, 2012

(65) Prior Publication Data

US 2013/0002324 A1   Jan. 3, 2013

Related U.S. Application Data

(63) Continuation of application No. 13/194,777, filed on Jul. 29, 2011, now Pat. No. 8,289,059, which is a continuation of application No. 12/553,792, filed on Sep. 3, 2009, now Pat. No. 7,999,589.

(51) Int. Cl.
*H03K 3/017* (2006.01)

(52) U.S. Cl.
USPC .......................................... 327/175; 327/172

(58) Field of Classification Search
None
See application file for complete search history.

(56) References Cited

U.S. PATENT DOCUMENTS

| | | |
|---|---|---|
| 5,179,303 A | 1/1993 | Searles et al. |
| 6,927,642 B2 | 8/2005 | Hsieh |
| 7,078,949 B2 | 7/2006 | Kim et al. |
| 7,308,065 B2 | 12/2007 | Donnelly et al. |
| 7,701,273 B2 | 4/2010 | Choi |
| 7,791,388 B2 | 9/2010 | Gomm |
| 7,999,589 B2 | 8/2011 | Lin |
| 8,289,059 B2 * | 10/2012 | Lin ............................... 327/175 |
| 2007/0159224 A1 | 7/2007 | Dwarka et al. |
| 2011/0279159 A1 | 11/2011 | Lin |

* cited by examiner

*Primary Examiner* — Cassandra Cox
(74) *Attorney, Agent, or Firm* — Dorsey & Whitney LLP

(57) ABSTRACT

Duty-cycle correction circuits, clock distribution networks, and methods for correcting duty-cycle distortion are disclosed, including methods and apparatus for correcting duty-cycle distortion of differential output clock signals provided from a clock distribution network. In one such method, a single-ended clock signal is generated from differential input clock signals for distribution over a clock distribution network and from which the differential output clock signals are generated. A delay of a model delay path is matched to a propagation delay of the clock distribution network, and the single ended clock signal is adjusted to compensate for duty-cycle distortion.

20 Claims, 6 Drawing Sheets

US 8,570,084 B2

CIRCUITS AND METHODS FOR CLOCK SIGNAL DUTY-CYCLE CORRECTION

CROSS-REFERENCE TO RELATED APPLICATION

This application is a continuation of U.S. patent application Ser. No. 13/194,777, filed Jul. 29, 2011, U.S. Pat. No. 8,289,059, which is a continuation of U.S. patent application Ser. No. 12/553,792, filed Sep. 3, 2009, U.S. Pat. No. 7,999,589. These applications and patents are incorporated by reference herein in their entirety and for any purposes.

TECHNICAL FIELD

Embodiments of the invention relate generally to clock signal generators, and more particularly, clock signal generators providing duty-cycle corrected clock signals over a clock distribution network.

BACKGROUND OF THE INVENTION

Clock signals are often used in electronic circuits for timing internal operation of various circuits necessary to execute an operation. For example, in synchronous memories, external clock signals are provided to the memory and internally distributed to different circuits of the circuit to carry out memory operations. Typically, a clock distribution network is used to route internal clock signals generated from the external clock signal to the different circuits. In this manner, operation of the integrated circuit can be coordinated with the external clock signals.

When generating and routing the internal clock signals, however, maintaining the quality of the clock signals while being distributed to the various circuits can present challenges. An example of a challenge to maintaining the quality of the clock signals is generating internal clock signals while maintaining the duty-cycle of the external clock signals. The duty-cycle of a clock signal becomes distorted when the ratio of the high and low portions of a generated clock signal is different than that of the clock signal from which it is generated. Duty-cycle distortion may be process-induced, that is, the device characteristics of the clock generation circuits and clock distribution circuits can shift due to variation in the manufacturing process for the integrated circuit causing the resulting internal clock signal to be distorted. As a result of the duty-cycle distortion, when generating and distributing the internal clock signal, the various circuits receive a distorted version of the external clock signal. Due to the duty-cycle distortion, performance of the integrated circuit may be reduced, and in extreme cases, may cause the integrated circuit to function incorrectly.

Various approaches have been used to manage duty-cycle distortion in generating and distributing internal clock signals. For example, where external differential clock signals (i.e., both a clock signal and its complement) are used, the clock distribution network includes differential clock paths having separate clock paths for each of the differential clock signals. As known, using differential clock paths may reduce duty-cycle distortion in distributing internal differential clock signals to various circuits. This approach, however, consumes significant power to drive the circuitry of the differential clock path and requires considerable space to accommodate the parallel clock paths of the differential clock path.

Another example approach is to generate two internal single-ended clock signals (sometimes referenced as "pseudo-differential") from an external differential clock signal and distribute the single-ended clock signals to be used to generate an internal differential clock signal for the various circuits. This approach also requires two separate clock paths to distribute the single-ended clock signals and suffers from the same issues as using a differential clock path, that is, significant power consumption and space for the two clock paths. Another example approach is to convert an external differential clock signal into a single-ended clock signal for distribution to the circuits. Although this approach has the benefits of using less power and requiring less space for the clock path in comparison to the previously discussed approaches, as known, distributing a single-ended clock signal and generating an internal differential clock signal from the single-ended clock signal is more susceptible to introducing duty-cycle distortion, such as that related to process-induced distortion.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
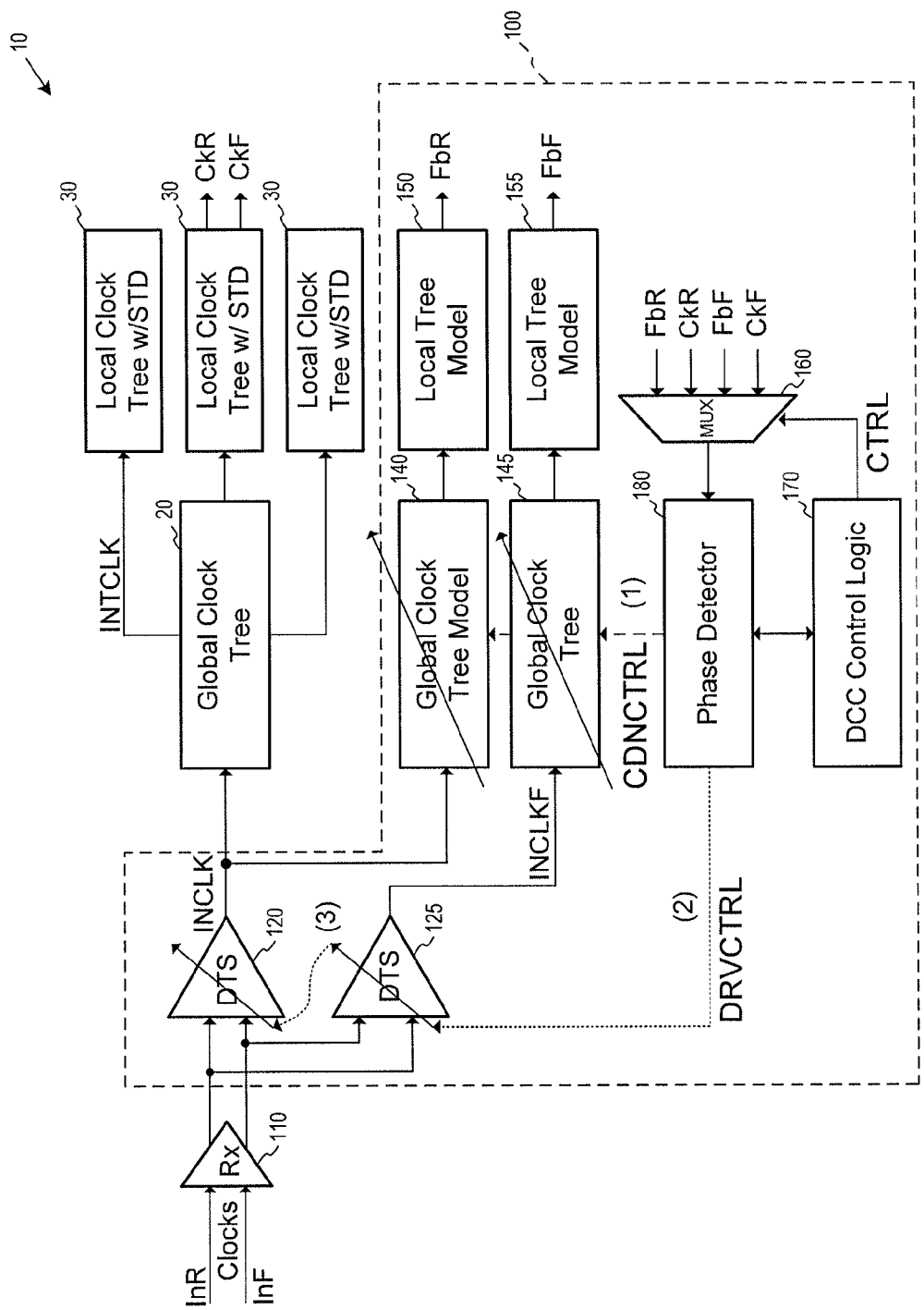
FIG. 1 is a block diagram of an example duty-cycle correction circuit.

FIG. 1 illustrates a duty-cycle correction (DCC) circuit 100 according to an embodiment of the invention and a portion of clock signal distribution network (CDN) 10. The CDN 10 includes a global clock tree circuit 20 that receives an input clock signal INCLK and distributes the INCLK signal throughout the circuit. In the embodiment of FIG. 1, the INCLK signal received by the global clock tree circuit 20 is a "single-ended" clock signal, that is, the global clock tree circuit 20 receives a clock signal but not its complementary clock signal. In contrast, both a clock signal and its complement are provided when "differential" clock signals are used. The global clock tree circuit 20 distributes the INCLK signal to local clock tree circuits and single-ended-to-differential (STD) clock driver 30 as an internal clock signal INTCLK. The local clock tree circuits and STD clock driver 30 generates differential clock signals CkR, CkF responsive to the distributed INTCLK signal. The CkR, CkF signals are typically provided to clocked circuitry, for example, clocked output data circuits, clocked input data circuits, and the like. A multi-level clock tree distribution network, as shown in FIG. 1, is used to efficiently provide the INCLK signal to various circuits located at different locations over a semiconductor die on which the integrated circuit is formed. Although two-levels of clock trees are shown in FIG. 1, other embodiments of the invention have greater or fewer levels of clock trees.

The DCC circuit 100 is coupled to the CDN 10 to provide the INCLK signal to the global clock tree circuit 20. The INCLK signal is generated by a differential-to-single-ended (DTS) clock driver 120 responsive to receiving differential input clock signal InR, InF from a differential clock receiver 110. As previously discussed, the differential clock signals, such as the InR, InF signals are complementary clock signals. The differential clock receiver 110 buffers the InR, InF signals before being provided to the DTS clock driver 120. The InR, InF, signals are further provided to a DTS clock driver 125 which generates an INCLKF signal responsive to the InR, InF signals. The INCLKF signal is complementary to the INCLK signal. In some embodiments, the DTS clock driver 120, 125 are the same in design and operation, and the INCLK and INCLKF signals are generated by reversing the InR, InF signals to the inputs of the respective DTS clock driver 120, 125. The DTS clock drivers 120, 125 have adjustable electrical characteristics that can be used to alter the INCLK, INCLKF signals. For example, in one embodiment, the DTS clock drivers 120, 125 have adjustable output drive strength controlled by a control signal DRVCTRL. The adjustable output drive strength adjusts the transition rates of clock edges of the output clock signal, for example, the transition rate of the rising edges of the output clock signal. The drive strength of the DTS clock drivers can be increased (i.e., faster slew rate, shorter clock transition time) or decreased (i.e., slower slew rate, longer clock transition time).

In addition to the DTS clock driver 120 providing the INCLK signal to the global clock tree circuit 20, the INCLK signal is provided to an adjustable global clock tree model 140. The global clock tree model 140 introduces a delay that models a propagation delay of the global clock tree circuit 20, and is additionally adjustable based on a control signal CDNCTRL to increase or decrease the delay introduced. The delayed INCLK signal is output to a local clock tree model 150, which introduces a delay that models a propagation delay of the local clock tree circuit and STD clock driver 30. Responsive to receiving the delayed INCLK signal, the local clock tree model 150 generates a feedback clock signal FbR. The INCLKF signal generated by the DTS clock driver 125 is provided through a similar set of model delays as the INCLK signal. In particular, the INCLKF signal is provided to a global clock tree model 145 that provides a delay similar to the global clock tree model 140, and is similarly adjusted by the CDNCTRL signal to increase or decrease the delay introduced. The delayed INCLKF signal is then provided to a local clock tree model 155 that introduces an additional delay that models a propagation delay of the local clock tree circuit and STD clock driver 30 to generate a feedback signal FbF. As a result of the INCLK and INCLKF signals provided through similar model delay paths, the FbR and FbF signals have the same delay relative to the INCLK and INCLKF signals, respectively.

A selection circuit 160 receives the CkR, CkF, FbR, FbF signals from the local clock tree circuit and STD clock driver 30 and the local clock tree models 150, 155. The selection circuit is controlled by DCC control logic 170 based on a control signal CTRL to selectively provide two input clock signals to a phase detector 180 for phase comparison. An example of the selection circuit 160 is a multiplexer circuit of conventional design and operation that provides two of the four input clock signals to the phase detector. As will be explained in detail below, the phase detector 180 compares the phases of the input clock signals and generates the CDNCTRL signal based at least in part thereon to adjust the delay of the global clock tree models 140, 145 to reduce and ideally eliminate a phase difference between the input clock signals. The DCC control logic 170 further controls the phase detector 180 to generate the DRVCTRL signal to adjust the DTS clock drivers 120, 125 based at least in part on a phase comparison to compensate for duty-cycle distortion.

Figure 2:
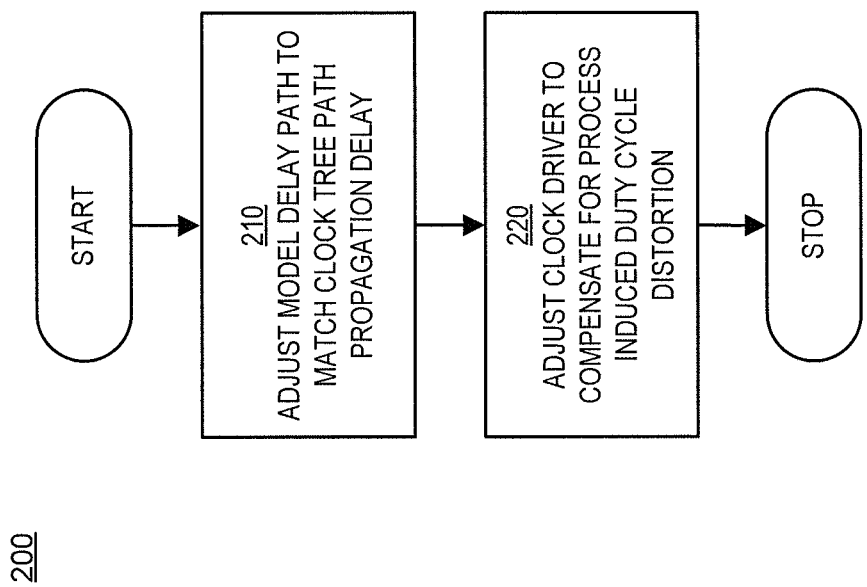
FIG. 2 is a flow diagram of an example for correcting duty-cycle distortion.

Operation of the DCC circuit 100 according to an embodiment of the invention will be described with reference to FIG. 2. In a first phase, the delay of the model delay paths are matched to the propagation delay of the clock tree path of the CDN 10 at 210, such as by adjusting the global clock tree model 140 so that the CkR and FbR signals are synchronized. The global clock tree model 145 is adjusted to have the same delay as the global clock tree model 140. As a result, the model delay paths for the FbR and the FbF signals have the same delay. Upon detecting completion of adjusting the global clock tree models 140, 145, for example, monitoring for a stable CDNCTRL signal indicating delay adjustments are no longer made, the DCC control logic 170 controls the DCC circuit 100 to switch into a second phase. In the second phase, the DTS clock driver 125 is adjusted, for example, drive strength, until duty-cycle distortion, as represented by a phase difference between the CkF and FbF signals, is compensated at 220. The DTS clock driver 120 is adjusted in the same manner, for example, by adjusting the DTS clock driver 120 to have same drive strength as the DTS clock driver 125. In some embodiments, the DTS clock driver 125 is first adjusted to provide a stable reference signal (e.g., CkF) before similarly adjusting the DTS clock driver 120 in the same manner. As a result of adjusting the DTS clock driver 120 to have the same characteristics as the DTS clock driver 125 that resulted in matching phases of the CkF and FbF signals, the CkR signal (and the CkF signal) are duty-cycle corrected. That is, the phase relationship of corresponding clock transitions of the CkR and CkF signals (e.g., rising edges of the CkR and CkF) are 180 degrees out of phase to represent duty-cycle corrected clock signals. In effect, where the corresponding clock transitions are used to clock respective circuits, for example, data output drivers, the respective circuits will operate as if clocked by a clock signal having a 50 percent duty cycle. The INCLK signal generated by the DTS clock driver 120 that is input to the clock tree network of the global clock tree 20, and local clock tree and STD clock driver 30, and used to generate the CkR, CkF signals, compensates for process induced duty-cycle distortion, for example, introduced by propagating a clock signal through the CDN 10. In some embodiments, the circuits of the DCC circuit 100 are disabled after completion of phases one and two in order to reduce power consumption. In some embodiments, the DCC circuit 100 remains activated, or is activated periodically to correct duty-cycle distortion.

Figure 3B:
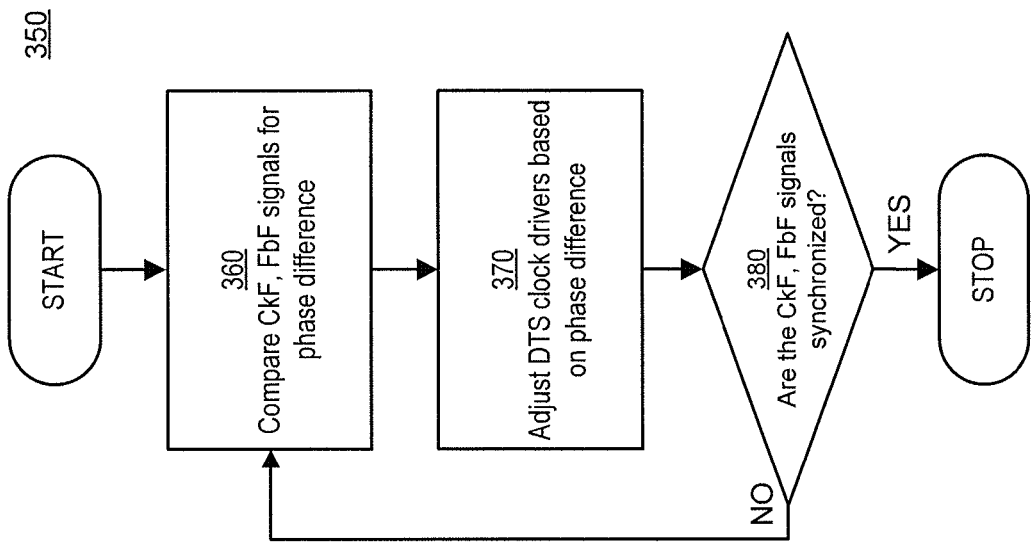
FIGS. 3A and 3B are flow diagrams of examples for correcting duty-cycle distortion.
Figure 3A:
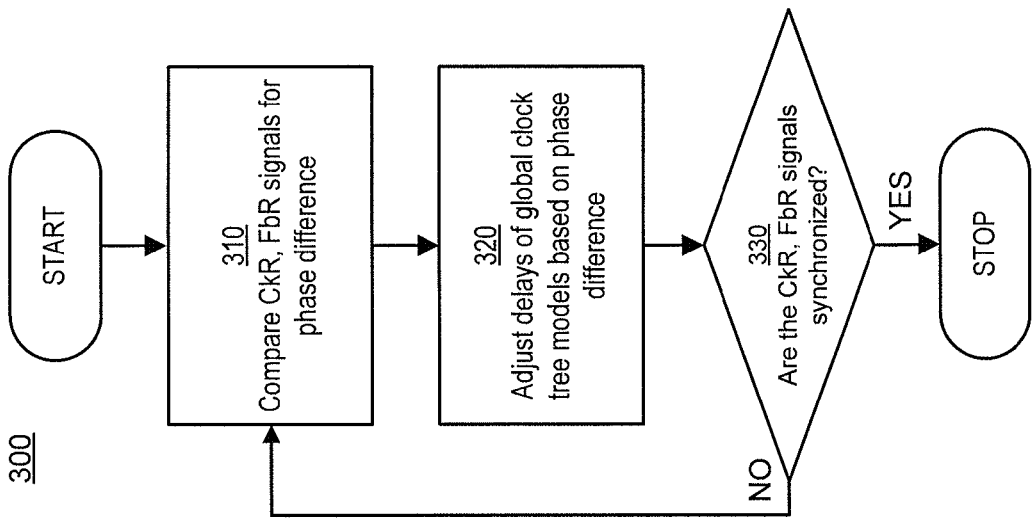

FIG. 3A illustrates a process 300 for matching the delay of the model delay path to the propagation delay of the clock tree path of the CDN 10 according to an embodiment of the invention. The DCC control logic 170 controls the selection circuit 160 to provide the CkR and FbR signals to the phase detector 180 for phase comparison at 310. The phase detector 180 generates the CDNCNTRL signal to adjust the adjustable delay of the global clock tree model 140 at 320 based at least in part on the comparison. Steps 310, 320 are repeated until the CkR and FbR signals are synchronized at 330. For example, where the CkR signal leads the FbR signal, the delay of the global clock tree model 140 is decreased to advance the phase of the FbR signal relative to the CkR signal until the signals are in phase. Conversely, where the CkR signal lags the FbR signal, the delay of the global clock tree model 140 is increased to retard the phase of the FbR signal relative to the CkR signal until the signals are in phase. When the global clock tree model 140 is adjusted to provide the delay to synchronize the CkR, FbR signals, the delay of the global clock tree model 145 is adjusted to provide the same delay. As a result, the delay of the model delay path for the FbR signal and the delay of the model delay path for the FbF signals are matched. In some embodiments, the adjustable delay of the global clock tree model 140 is a digital delay that is adjusted using digital values provided by the phase detector 180 as the CDNCTRL signal. The global clock tree model 145 may have the same design as the global clock tree model 140 and the delays matched by providing the same CDNCTRL signal (i.e., digital value) to the global clock tree model 145. In other embodiments, different types of adjustable delays and delay control may be used.

FIG. 3B illustrates a process 350 for adjusting the DTS clock driver 120 to compensate for process induced duty-cycle distortion according to an embodiment of the invention. The DCC control logic 170 controls the selection circuit 160 to provide the CkF and FbF signals to the phase detector 180 for phase comparison at 360. The phase detector 180 generates the DRVCTRL signal to adjust the DTS clock driver 125 based at least in part on the phase comparison, and similarly adjusts DTS clock driver 120 (e.g., using the same DRVCTRL signal) at 370. Steps 360, 370 are repeated until the phase detector 180 detects synchronization of the CkF and FbF signals at 380. In some embodiments, the DTS clock driver 125 is initially adjusted until the phase detector 180 detects synchronization of the CkF and FbF signals before then similarly adjusting the DTS clock driver 120. For example, in an embodiment having DTS clock drivers 120, 125 with adjustable output drive strength, the slew rate of the INCLKF signal is adjusted until the phase detector 180 detects synchronization of the FbF signal with the CkF signal. Adjusting the slew rate of the INCLKF and INCLK signals can compensate for duty-cycle distortion. For example, where the distortion decreases the duty cycle (e.g., the time the clock signal is HIGH is less than 50 percent), the drive strengths of the DTS clock drivers 120, 125 can be decreased to compensate by providing a lower slew rate. Conversely, where the distortion increases the duty cycle (e.g., the time the clock signal is HIGH is greater than 50 percent), the drive strengths of the DTS clock drivers 120, 125 can be increased to compensate by providing a higher slew rate. In other embodiments, the DTS clock drivers 120, 125 have adjustable characteristics other than adjustable drive strengths, for example, an adjustable propagation delay.

Figure 4:
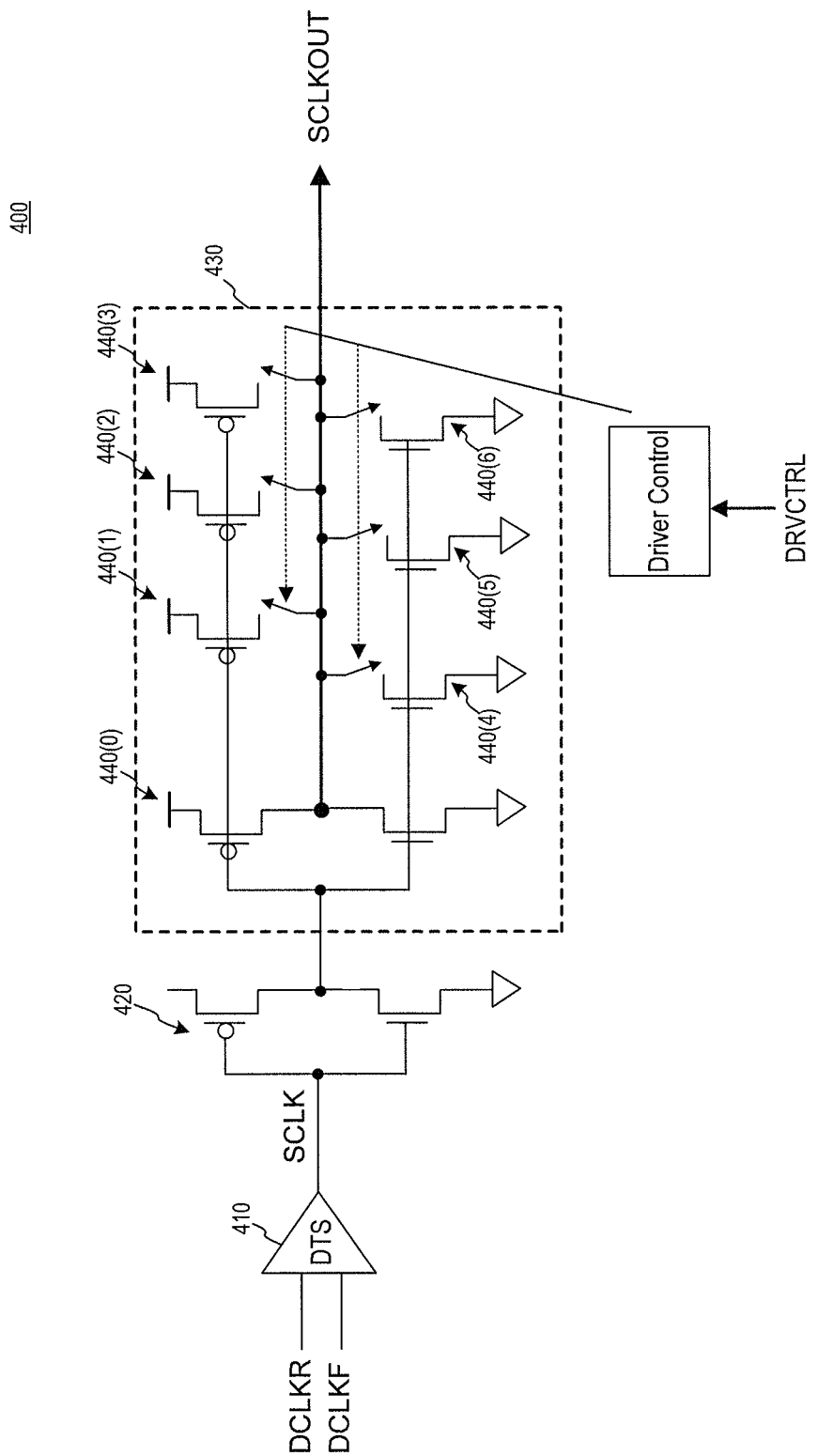
FIG. 4 is a block diagram of an example differential-to-single-ended clock driver.

FIG. 4 illustrates a DTS clock driver 400 having adjustable drive strength according to an embodiment of the invention. The DTS clock driver 400 includes a DTS clock driver stage 410 that receives differential input clock signals DCLKR, DCLKF, and in response, generates a single-ended clock signal SCLK. The SCLK signal is provided to an inverter 420 that inverts the SCLK signal to be provided to an adjustable inverter circuit 430. The adjustable inverter circuit 430 inverts the signal from the inverter 420 and drives a single-ended output signal SCLKOUT. The adjustable inverter circuit 430 includes an inverter stage 440(0) and a plurality of pull-up and pull-down transistors 440(1)-(6). Although six pull-up and pull-down transistors 440(1)-(6) are illustrated in FIG. 4, greater or fewer pull-up and pull-down transistors can be used as well. Each of the pull-up and pull-down transistors 440(1)-(6) can be selectively coupled to the output of the DTS clock driver 400 to increase drive strength of the adjustable inverter circuit 430, and as a result, increase the drive strength of DTS clock driver 400. The pull-up and pull-down transistors 440(1)-(6) may be coupled to the output independently. Coupling of the pull-up and pull-down transistors 440(1)-(6) is controlled by a control signal, for example, DRVCTRL. The pull-up and pull-down transistors 440(1)-(6) may be identical, or have different drive characteristics. In some embodiments, the DTS clock driver 410 is additionally adjustable to adjust a duty cycle of the SCLK signal provided to the inverter 420 to add flexibility in adjusting the duty cycle of the SCLKOUT signal.

Figure 5A:
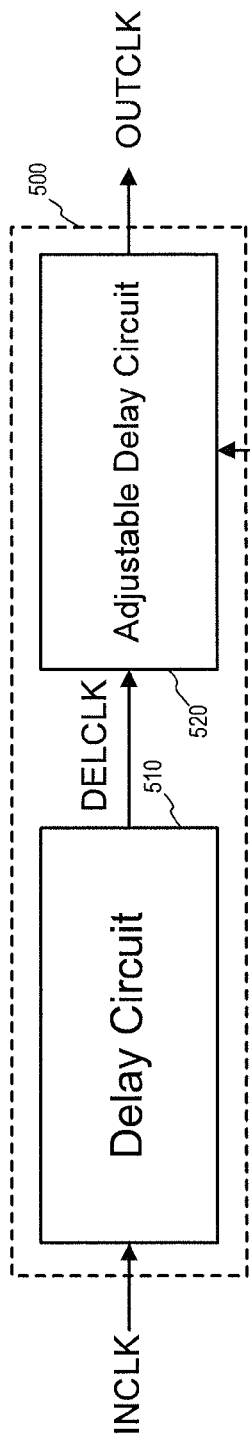
FIG. 5A is a block diagram of an example adjustable global clock tree model.
Figure 5B:
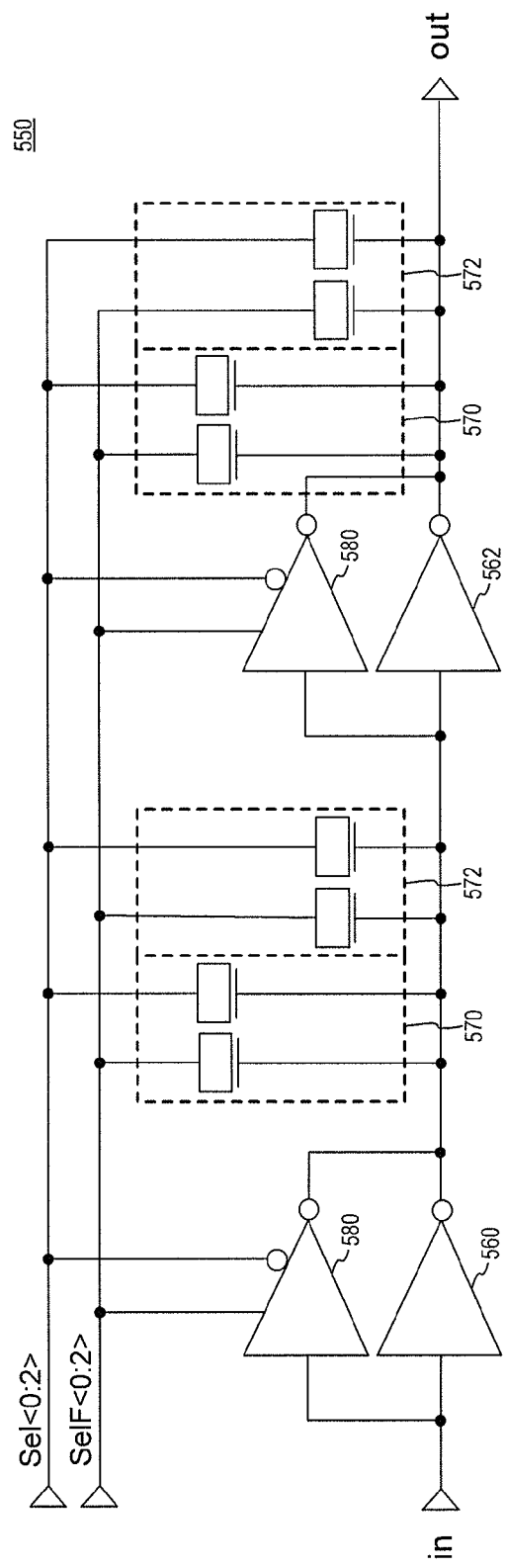
FIG. 5B is a block diagram of an example adjustable delay circuit that may be used in the example adjustable global clock tree model of FIG. 5A.

FIG. 5A illustrates a global clock tree model 500 according to an embodiment of the invention. The global clock tree model 500 includes a delay circuit 510 and an adjustable delay circuit 520 coupled in series. An input clock signal INCLK applied to the global clock tree model 500 will be delayed by the total delay of the delay circuit 510 and the adjustable delay circuit 520 to provide an output clock signal OUTCLK. The adjustable delay circuit 520 has an adjustable delay that is set based on a control signal (or signals) SEL, SELF. FIG. 5B illustrates an adjustable delay circuit 550. The adjustable delay circuit 500 includes series coupled inverters 560, 562 to generate the OUTCLK signal responsive to the INCLK signal. Impedance circuits 570, 572 coupled to the outputs of the inverters 560, 562 can be used to selectively increase the loading at the outputs thereby providing a delay to the DELCLK signal. Which of the impedance circuits 570, 572 will be used to increase the loading of the outputs of the inverters 560, 562 is controlled by the SEL, SELF signals, for example, the control signal CDNCTRL from the DCC control logic 170 (FIG. 1). The impedance circuits 570, 572 are shown in FIG. 5B as capacitance coupled to the outputs of the inverters 560, 562. The capacitances may have different capacitance characteristics, or alternatively, have the same capacitance characteristics. Types of impedance circuits other than capacitors may be used as well. The adjustable delay circuit 550 further includes secondary inverters 580 that are activated by the SEL, SELF signals. The drive characteristics of the secondary inverters 580 may be different than those of the inverters 560, 562 in order to reduce the overall drive capability of the adjustable delay circuit 500, thereby adding delay to the DELCLK signal in generating the OUTCLK signal. The SEL, SELF signals are shown in FIG. 5B as a three-bit value, with each bit controlling a respective impedance circuit 570, 572 or secondary inverter 580. It will be appreciated, however, that fewer or greater impedance circuits and/or inverters and secondary inverters may be used with corresponding control signals without departing from the scope of the invention.

Figure 6:
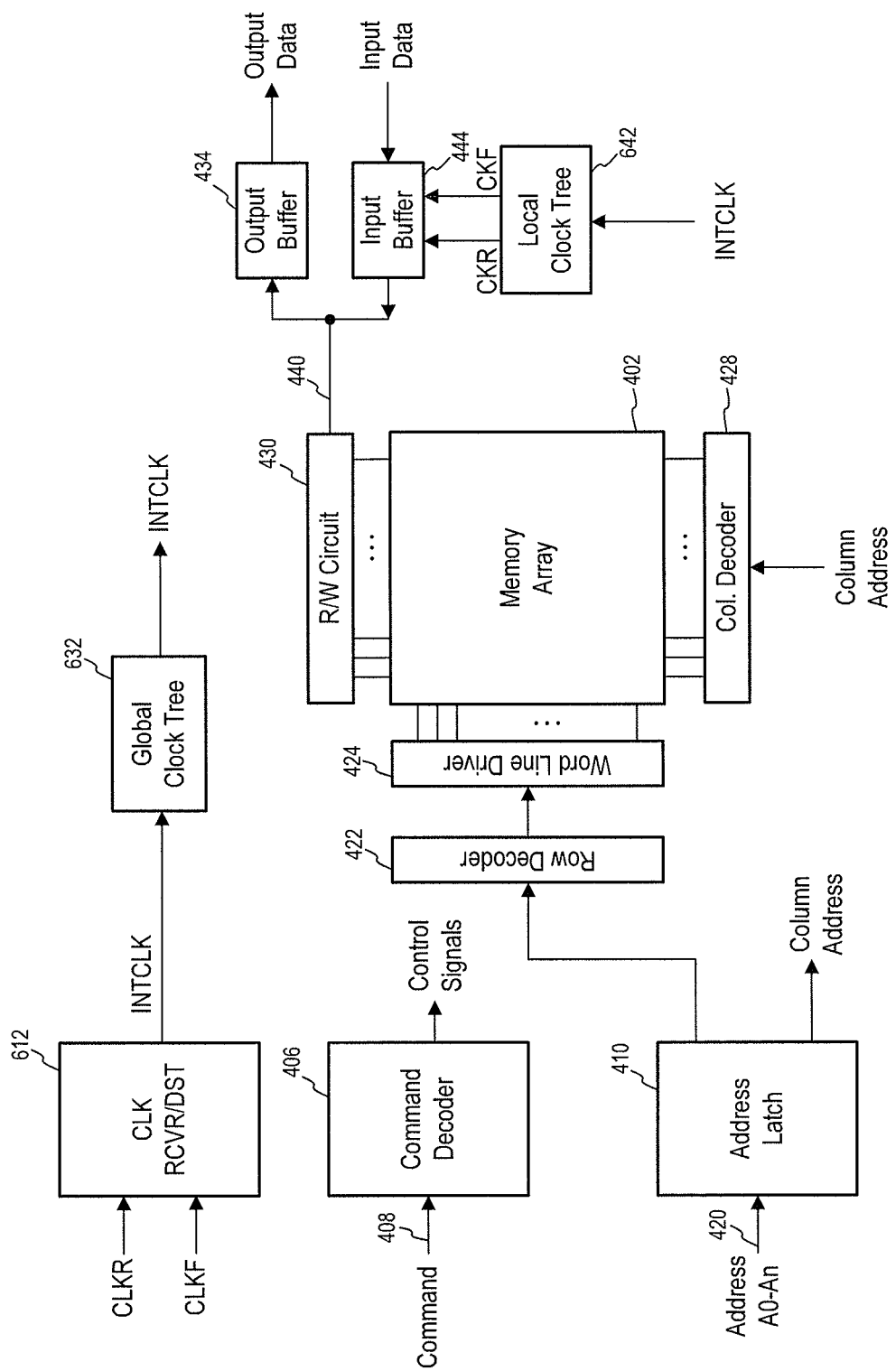
FIG. 6 is a block diagram of a memory having a duty-cycle correction circuit according to an embodiment of the invention.

FIG. 6 illustrates a portion of a memory 600 according to an embodiment of the present invention. The memory 600 includes an array 602 of memory cells, which may be, for example, DRAM memory cells, SRAM memory cells, flash memory cells, or some other types of memory cells. The memory 600 includes a command decoder 606 that receives memory commands through a command bus 608 and generates corresponding control signals within the memory 600 to carry out various memory operations. A clock receiver and differential-to-single-ended clock driver 612 receives differential input clock signals CLKR, CLKF and generates a single-ended input clock signal INCLK. The INCLK signal is provided to a global clock tree 632 for distribution of the INCLK to various circuits of the memory 600 as the internal clock signal INTCLK.

Row and column address signals are applied to the memory 600 through an address bus 620 and provided to an address latch 610. The address latch then outputs a separate column address and a separate row address. The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses.

The selected data line (e.g., a bit line or bit lines) corresponding to a received column address are coupled to a read/write circuitry 630 to provide read data to a data output buffer 634 via an input-output data bus 640. Write data are applied to the memory array 602 through a data input buffer 644 and the memory array read/write circuitry 630. The data input buffer 644 is clocked by differential clock signals CkR, CkF provided by the local clock tree and single-ended-to-differential (STD) clock driver 642. The CkR, CkF signals are generated based at least in part on the INTCLK signal provided to the local clock tree and STD clock driver 642 from the global clock tree 632. The CkR, CkF signals are provided to a DCC circuit 638 that generates a driver control signal DRVCTRL. The DRVCTRL signal is used to adjust a clock driver in the clock receiver and differential-to-single-ended clock driver 612 to compensate for process induced duty-cycle distortion, thereby correcting the duty-cycle of the CkR, CkF signals. The command decoder 606 responds to memory commands applied to the command bus 608 to perform various operations on the memory array 602. In particular, the command decoder 606 is used to generate internal control signals to read data from and write data to the memory array 602.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A duty-cycle corrector, comprising:
 a driver configured to receive a differential signal and generate a single-ended input signal based, at least in part, on a first control signal;
 a clock tree configured to receive a delayed input signal, the delayed input signal based, at least in part, on the single-ended input signal delayed by a first time, the first time based, at least in part, on a second control signal, the clock tree further configured to delay the delayed input signal a second time to provide at least one of a first feedback signal or a second feedback signal; and
 a phase detector coupled to the clock tree and configured to provide the first control signal based, at least in part, on a phase difference between a first output signal and the first feedback signal, the phase detector further configured to provide the second control signal based, at least in part, on a second output signal and the second feedback signal.

2. The duty-cycle corrector of claim 1, further comprising a global clock tree coupled to the driver and configured to delay the single-ended input signal the first time to produce the delayed input signal.

3. The duty-cycle corrector of claim 2, wherein the global clock tree comprises a plurality delay circuits that are configured to delay the single-ended signal the first time.

4. The duty-cycle corrector of claim 1, further comprising a multiplexer configured to provide to the phase detector, one of:
 the first output signal and the first feedback signal; or
 the second output signal and the second feedback signal.

5. An apparatus, comprising:
 a first driver configured to receive a differential signal and provide a first single-ended input signal based on a first control signal, wherein the first single-ended signal is converted into a first clock signal and a second clock signal, wherein the second clock signal is a complement to the first clock signal;
 a second driver configured to receive the differential signal and provide a second single-ended input signal based on the first control signal;
 a first clock tree model configured to receive the first single-ended input signal, the first clock tree configured to delay the first single-ended input signal a delay time based on a second control signal to provide a first feedback signal;
 a second clock tree model configured to receive the second single-ended input signal, the second clock tree configured to delay the second single-ended input signal the delay time based on a second control signal to provide a second feedback signal; and
 a phase detector coupled to the driver, to the first clock tree model, and to the second clock tree model, the phase detector configured to provide the second control signal in a first mode, the second control signal based a comparison of the first feedback signal and the first clock signal, the phase detector further configured to provide the first control signal in a second mode, the first control signal based on a comparison of the second clock signal and the second feedback signal.

6. The apparatus of claim 5, wherein the phase detector is further configured to compare a phase of the first clock signal with a phase of the first feedback signal.

7. The apparatus of claim 5, wherein the phase detector is further configured to compare a phase of the second clock signal with a phase of the second feedback signal.

8. The apparatus of claim 5, wherein the phase detector is further configured to switch to the second mode when a phase of the first feedback signal matches a phase of the first clock signal.

9. The apparatus of claim 5, wherein a drive strength of the first driver is approximately equal to a drive strength of the second driver.

10. The apparatus of claim 5, wherein a first portion of the delay time is based on the second control signal and a second portion of the delay time is a fixed amount of time.

11. The apparatus of claim 10, wherein the first clock tree model comprises a plurality of delay circuits, the first clock tree model configured to enable a subset of the plurality of delay circuits based on the second control signal.

12. The apparatus of claim 11, wherein the subset of the plurality of delay circuits is configured to provide the first portion of the delay time.

13. The apparatus of claim 5, wherein the first single-ended signal is complementary to the second single-ended signal and the first feedback signal is complementary to the second feedback signal.

14. A method, comprising:
 providing a first single-ended signal and a second single-ended signal at a duty-cycle correction circuit;
 delaying the first single-ended signal a delay time to produce a first feedback signal;

delaying the second single-ended signal the delay time to produce a second feedback signal;

providing a first control signal based on the first feedback signal and a first clock signal, wherein the first clock signal is based on the first single-ended signal;

adjusting the delay time based on the second control signal;

providing a second control signal based on a second clock signal and the second feedback signal, wherein the second clock signal is based on the first single-ended signal, wherein the second clock signal is a complement of the first clock signal; and adjusting the first single-ended signal and the second single-ended signal based on the first control signal.

15. The method of claim 14, further comprising receiving a differential clock signal, wherein providing the first single-ended signal is further based on the differential clock signal, and wherein providing the second single-ended signal is further based on the differential clock signal.

16. The method of claim 14, wherein providing the first control signal comprises comparing a phase of the first clock signal and a phase of the first feedback signal, and wherein providing the second control signal comprises comparing a phase of the second clock signal and a phase of the second feedback signal.

17. The method of claim 14, wherein providing the first control signal based on the first clock signal is during a first mode, and wherein providing the second control signal is during a second mode.

18. The method of claim 17, further comprising switching from the first mode to the second mode based on a phase of the first clock signal being approximately equal to a phase of the first feedback signal.

19. The method of claim 17, wherein adjusting the first single-ended signal and the second single-ended signal comprises:

adjusting a first driver of the duty-cycle correction circuit to provide the first single-ended signal; and adjusting a second driver of the duty-cycle correction circuit to provide the second single-ended signal.

20. The method of claim 14, wherein delaying the first single-ended signal the delay time comprises enabling one or more delay circuits.

\* \* \* \* \*

UNITED STATES PATENT AND TRADEMARK OFFICE
CERTIFICATE OF CORRECTION

| | | |
|---|---|---|
| PATENT NO. | : 8,570,084 B2 | Page 1 of 1 |
| APPLICATION NO. | : 13/610526 | |
| DATED | : October 29, 2013 | |
| INVENTOR(S) | : Feng Lin | |

It is certified that error appears in the above-identified patent and that said Letters Patent is hereby corrected as shown below:

Title page, in item (57), under "Abstract", in column 2, line 11, delete "single ended" and insert -- single-ended --, therefor.

In the Specification:

In column 1, line 12, delete "purposes." and insert -- purpose. --, therefor.

In the Claims:

In column 7, line 66, in Claim 3, delete "plurality" and insert -- plurality of --, therefor.

In column 8, line 30, in Claim 5, delete "based" and insert -- based on --, therefor.

Signed and Sealed this
Twenty-eighth Day of January, 2014

Michelle K. Lee
*Deputy Director of the United States Patent and Trademark Office*